(12) United States Patent
Sample

(10) Patent No.: US 12,088,287 B1
(45) Date of Patent: Sep. 10, 2024

(54) LOW-CURRENT RUN PLUG ENHANCED SAFETY CIRCUIT FOR UNDERWATER SYSTEMS

(71) Applicant: United States of America as represented by the Secretary of the Navy, San Diego, CA (US)

(72) Inventor: Dwane F. Sample, Spokane, WA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 25 days.

(21) Appl. No.: 18/303,771

(22) Filed: Apr. 20, 2023

(51) Int. Cl.
*H03K 17/687* (2006.01)
*H03K 17/06* (2006.01)
*H03K 17/0812* (2006.01)

(52) U.S. Cl.
CPC ......... *H03K 17/687* (2013.01); *H03K 17/063* (2013.01); *H03K 17/08122* (2013.01)

(58) Field of Classification Search
None
See application file for complete search history.

(56) References Cited

U.S. PATENT DOCUMENTS

2023/0088777 A1\* 3/2023 Sample ............ H01M 8/04276
429/50

\* cited by examiner

*Primary Examiner* — Jeffrey S Zweizig
(74) *Attorney, Agent, or Firm* — Naval Information Warfare Center, Pacific; Kyle Eppele; J. Eric Anderson

(57) ABSTRACT

A low-current run plug circuit comprising: a run plug configured to electrically connect $1^{st}$ and $2^{nd}$ terminals when the run plug is installed; a safety circuit mounted within the battery-powered apparatus comprising: a JFET a current set resistor a P-channel MOSFET, a voltage divider, and an N-channel MOSFET connected together such that when the run plug is removed the N-channel MOSFET and the P-channel MOSFET are in cutoff wherein no current flows to the electrical load, and such that when the run plug is installed, the safety circuit creates a low-impedance electrical path from the cathode to the electrical load.

20 Claims, 4 Drawing Sheets

LOW-CURRENT RUN PLUG ENHANCED SAFETY CIRCUIT FOR UNDERWATER SYSTEMS

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, CA, 92152; voice (619) 553-5118; NIWC_Pacific_T2@us.navy.mil. Reference Navy Case Number 112563.

BACKGROUND OF THE INVENTION

Often, battery-powered systems will make use of a "run plug". FIG. 1 is an illustration of a prior art run plug configuration. Previously, run plugs were most often implemented by running the internal battery leads to pins on an external connector. The traditional run plug, when installed, shorts the battery source lead back into the internal electronics. In this way, when the traditional run plug is removed, the system is off, and no power is consumed, and when it is installed, the system is powered. In the traditional design, such as shown in FIG. 1, all of the available battery power is present at the connector. There is a need for an improved/safer run plug.

SUMMARY

Described herein is an embodiment of a low-current run plug circuit comprising $1^{st}$ and $2^{nd}$ terminals, a run plug, and a safety circuit. The $1^{st}$ and $2^{nd}$ terminals are configured to pass through an external wall of a battery-powered apparatus. The run plug is configured to electrically connect the $1^{st}$ and $2^{nd}$ terminals on an exterior side of the external wall when the run plug is installed. When the run plug is removed no current flows between the $1^{st}$ and $2^{nd}$ terminals. The safety circuit is mounted within the battery-powered apparatus and comprises a JFET, a current set resistor, a P-channel MOSFET, a voltage divider, and an N-channel MOSFET. The JFET has a gate terminal ($G_1$), a drain terminal ($D_1$), and a source terminal ($S_1$). The drain terminal $D_1$ is configured to be electrically connected to a cathode of the apparatus' battery. The current set resistor (RA) is electrically connected between the $1^{st}$ terminal and $S_1$. The gate terminal $G_1$ is electrically connected between the $1^{st}$ terminal and RA such that a current $I_A$ flowing to the $1^{st}$ terminal is set by a transfer function of the JFET and $R_A$. The P-channel MOSFET has a gate terminal ($G_2$), a drain terminal ($D_2$), and a source terminal ($S_2$). The drain terminal $D_2$ is configured to be electrically connected to an electrical load within the battery-powered apparatus. The voltage divider has an input ($V_{in}$), an output ($V_{out}$), and a ground terminal ($GR_1$). The Input $V_{in}$ is electrically connected to $S_2$ and $D_1$, and the output $V_{out}$ is electrically connected to $G_2$. The N-channel MOSFET has a gate terminal ($G_3$), a drain terminal ($D_3$), and a source terminal ($S_3$). The drain terminal $D_3$ is electrically connected to $GR_1$. The gate terminal $G_3$ is electrically connected to the $2^{nd}$ terminal, and $S_3$ is electrically connected to a ground such that when the run plug is removed the N-channel MOSFET and the P-channel MOSFET are in cutoff wherein no current flows to the electrical load. When the run plug is installed, the safety circuit creates a low-impedance electrical path from the cathode to the electrical load.

An embodiment of the low-current run plug circuit is described herein as comprising a run plug receptacle, a run plug, and a safety circuit. The run plug receptacle has $1^{st}$ and $2^{nd}$ terminals and is mounted to an external wall of a battery-powered apparatus. The run plug is configured to plug into the run plug receptacle so as to electrically connect the $1^{st}$ and $2^{nd}$ terminals such that when the run plug is removed no current flows between the $1^{st}$ and $2^{nd}$ terminals. The safety circuit is disposed within the battery-powered apparatus and comprises a JFET, a P-channel MOSFET, a voltage divider, and an N-channel MOSFET. In this embodiment, the JFET has a drain terminal $D_1$ that is electrically connected to a cathode of the apparatus' battery. The P-channel MOSFET has a drain terminal $D_2$ that is electrically connected to an electrical load within the apparatus. The voltage divider has an input $V_{in}$ that is electrically connected to the cathode, $D_1$, and to a source terminal $S_2$ of the P-channel MOSFET. The voltage divider further has an output $V_{out}$ that is electrically connected to a gate terminal $G_2$ of the P-channel MOSFET. The N-channel MOSFET has: a drain terminal $D_3$ that is electrically connected to a ground terminal $GR_1$ of the voltage divider; a gate terminal $G_3$ that is electrically connected to the $2^{nd}$ terminal; and a source terminal $S_3$ that is electrically connected to a ground. When the run plug is removed from the receptacle, the N-channel MOSFET and the P-channel MOSFET are in cutoff wherein no current flows from the battery to the electrical load. When the run plug is installed, the safety circuit creates a low-impedance electrical path from the battery to the electrical load.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed circuit below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
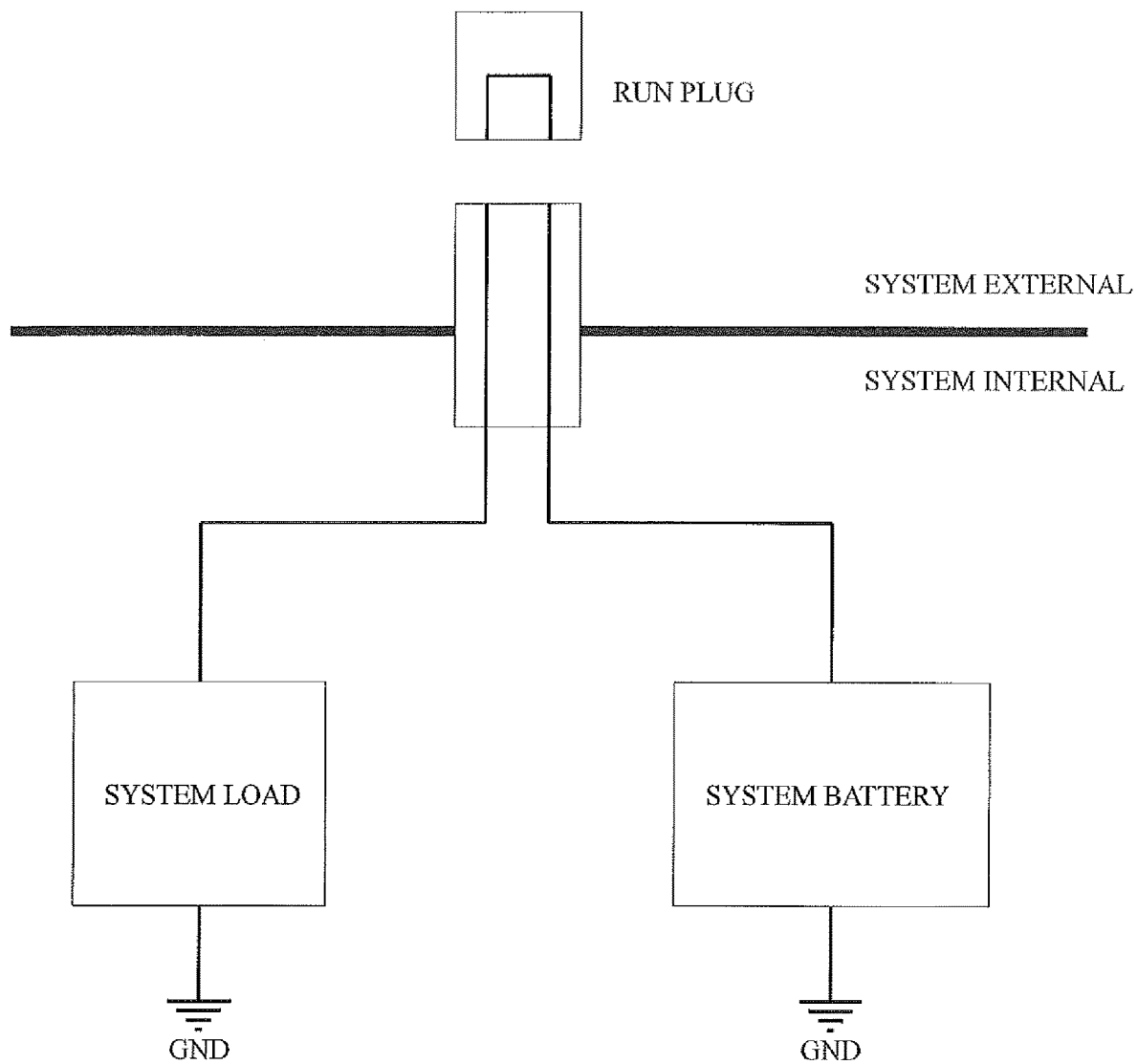
FIG. 1 is a schematic of a prior art version of a run plug circuit.
Figure 2:
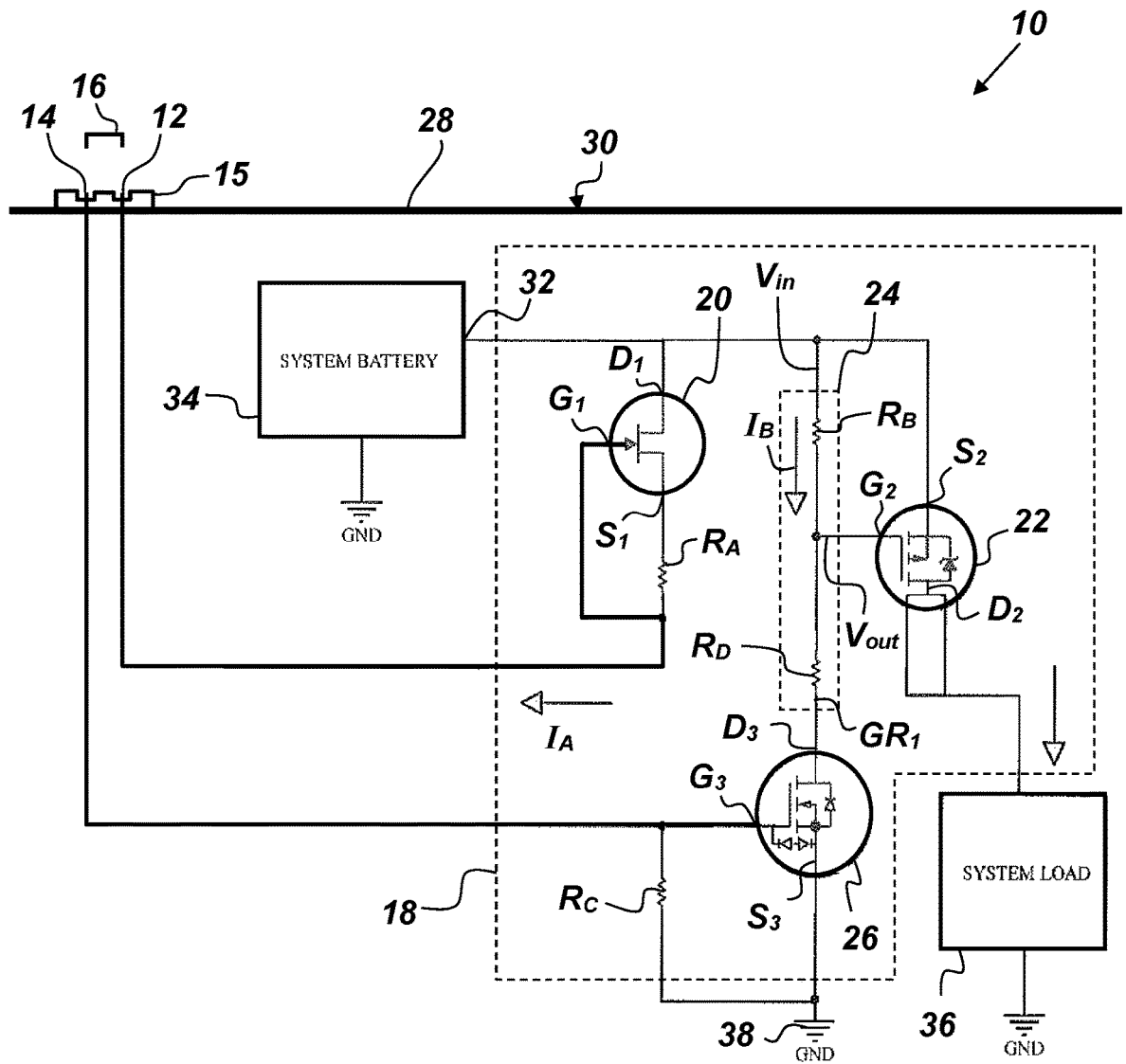
FIG. 2 is a schematic of an embodiment of a low-current run plug circuit.

FIG. 2 is a schematic of an embodiment of a low-current run plug circuit 10 that comprises, consists of, or consists essentially of first and second terminals 12 and 14 respectively, a run plug 16, and a safety circuit 18. The safety circuit 18 in this embodiment comprises, consists of, or consists essentially of a junction field effect transistor (JFET) 20, a current set resistor $R_A$, a P-channel enhancement mode metal oxide silicon field effect transistor (MOSFET) 22, a voltage divider 24, and an N-channel MOSFET 26. The first and second terminals 12 and 14 are configured to electrically connect to the safety circuit 18 and form part of a receptacle 15 that is mounted to an external wall 28 of a battery-powered apparatus. The run plug 16 is configured to plug into the receptacle 15 so as to electrically connect the first and second terminals 12 and 14 on an exterior side 30 of the external wall 28 when the run plug 16 is installed (i.e., plugged into the receptacle 15). When the run plug 16 is removed (i.e., unplugged from the receptacle 15 and disconnected from the first and second terminals 12 and 14) no current flows between the first and second terminals 12 and 14. As shown in FIG. 2, the JFET 20 comprises a gate terminal $G_1$, a drain terminal $D_1$, and a source terminal $S_1$. The drain terminal $D_1$ is configured to be electrically connected to a cathode 32 of the apparatus' battery 34. The current set resistor $R_A$ is electrically connected between the $1^{st}$ terminal and $S_1$, and G is electrically connected between the $1^{st}$ terminal and $R_A$ such that a control current $I_A$ flowing to the $1^{st}$ terminal is set by a transfer function of the JFET 20 and the set resistor $R_4$.

Still referring to FIG. 2, the P-channel MOSFET 22 in this embodiment has a gate terminal $G_2$, a drain terminal $D_2$, and a source terminal $S_2$. The drain terminal $D_2$ is configured to be electrically connected to an electrical load 36 within the apparatus. The voltage divider 24 has an input $V_{in}$, an output $V_{out}$, and a ground terminal $GR_1$. The input $V_{in}$ is electrically connected to $S_2$ and $D_1$, and the output $V_{out}$ is electrically connected to $G_2$. The N-channel MOSFET 26 has a gate terminal $G_3$, a drain terminal $D_3$, and a source terminal $S_3$. The drain terminal $D_3$ is electrically connected to $GR_1$, $G_3$ is electrically connected to the $2^{nd}$ terminal 14, and $S_3$ is electrically connected to a ground 38 such that when the run plug 16 is removed, the N-channel MOSFET 26 and the P-channel MOSFET 22 are in cutoff wherein no current flows to the electrical load 36. When the run plug 16 is installed (i.e., connecting the $1^{st}$ and $2^{nd}$ terminals), the safety circuit 18 creates a low-impedance electrical path from the cathode 32 to the electrical load 36.

The low-current run plug circuit 10 reduces the risk of a spark being created inside the receptacle 15 by high-start surge currents when the run plug 16 is inserted into the receptacle 15. Sparks can damage the receptacle itself and could result in an explosion (e.g., if flammable vapors are in the vicinity). Since only a small fraction of the power available from the system battery 34 is present at the receptacle 15, this reduces the possibility of the run plug 16 (or any other conductor in contact with the $1^{st}$ and $2^{nd}$ terminals 12 and 14 being exposed to dangerous levels of electrical current while connecting the $1^{st}$ and $2^{nd}$ terminals. This small amount of current (e.g., 10s of microamps) that flows through the run plug 16 allows for the use of very small conductors when connecting the $1^{st}$ and $2^{nd}$ terminals 12 and 14 to the safety circuit 18. For example, the current set resistor $R_A$ and the gate terminal $G_3$ may be electrically connected respectively to the $1^{st}$ and $2^{nd}$ terminals 12 and 14 by wires having a gauge of 28 to 38.

The low-current run plug circuit 10 may be used with any battery-powered apparatus. For example, it may be beneficial to use the run plug circuit 10 in connection with platforms that are designed to function underwater such as autonomous underwater vehicles (AUVs). In such embodiments, the receptacle 15 may be directly exposed to seawater. The run plug circuit 10 is also well-suited for use in devices that are intended to operate in environments where flammable vapors may be present where a spark at the $1^{st}$ and $2^{nd}$ terminals 12 and 14 could cause an explosion.

Referring back to the embodiment of the low-current run plug circuit 10 shown in FIG. 2, when the run plug 16 is installed, the safety circuit 18 is configured such that electrical current flows through the run plug 16 and creates a voltage at gate terminal $G_3$ sufficient to drive the N-channel MOSFET 26 to saturation. When the MOSFET 26 is driven to saturation, the N-channel MOSFET 26 pulls current $I_B$ from the apparatus' battery 34 through the voltage divider 24 so as to pull the P-channel MOSFET 22 into saturation as well.

In the embodiment of the low-current run plug circuit 10 shown in FIG. 2, the voltage divider 24 comprises a resistor $R_B$ electrically connected in series to a resistor $R_D$, which is directly connected to the ground terminal $GR_1$. The resistor $R_B$ is directly connected to input $V_{in}$. The output $V_{out}$ is electrically connected between resistors $R_B$ and $R_D$ as shown in FIG. 2. A resister Rc that is electrically connected between the ground 38 and the $2^{nd}$ terminal 14 is also shown in FIG. 2.

In an AUV embodiment of the low-current run plug circuit 10, the external wall 28 is the hull of the AUV and forms a water-tight enclosure around the safety circuit 18. The unique design of the safety circuit 10 allows for the receptacle 15 to be mounted on the exterior side 30 of the external wall 28 such that the receptacle 15 is directly exposed to water, in which the AUV is navigating with reduced risk of electrical shock at the exterior of the AUV. The control current $I_A$ flowing to the $1^{st}$ terminal from the JFET 20 may be set to a desired low value (e.g., 10 microamps) as controlled by the JFET 20 and a resistance value of the resistor $R_A$.

Figure 3:
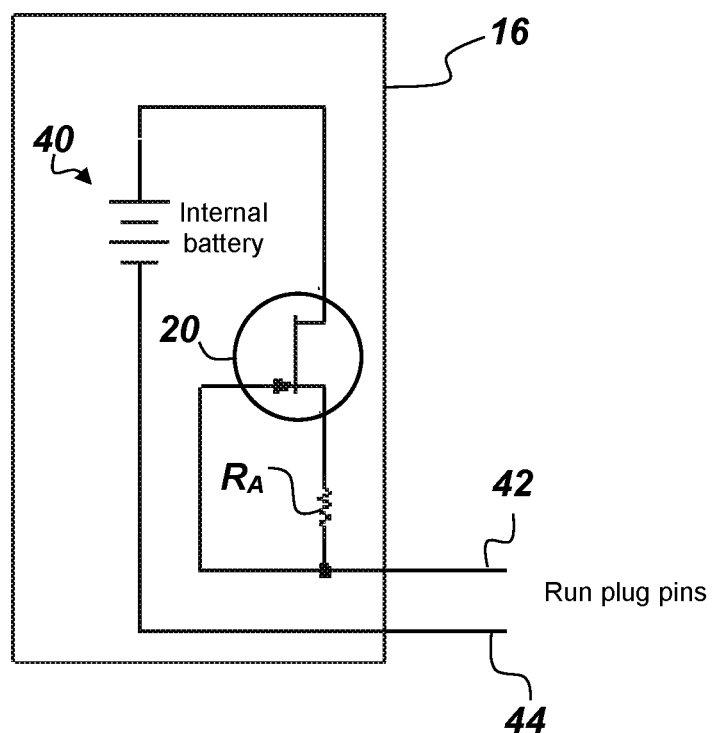
FIG. 3 is a schematic of an embodiment of a run plug.

FIG. 3 is a schematic illustration of an embodiment of the run plug 16 where the run plug 16 has its own internal battery 40 such that when run plug pins 42 and 44 connect respectively to the $1^{st}$ and $2^{nd}$ terminals 12 and 14, the run plug 16's internal battery powers the JFET 20 with a predefined amount of power such that the run plug 16 functions as a key to the safety circuit 18. The embodiment of the run plug 16 with the internal battery may be used in timed operations where the internal battery is capable of keeping the electrical load 36 connected to the battery 34 for a fixed period of time, after which the connection between the electrical load 36 and the system battery 34 is severed.

Figure 4:
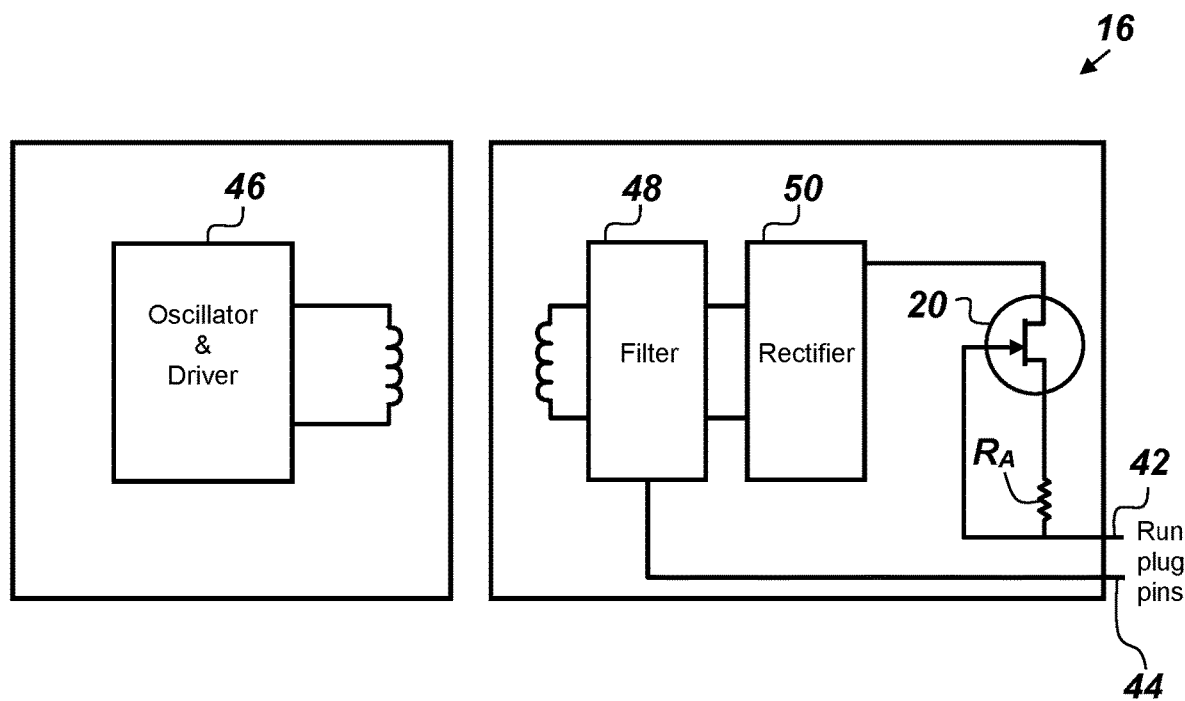
FIG. 4 is a schematic of an embodiment of a run plug.

FIG. 4 is a schematic illustration of a frequency-keyed embodiment of the run plug 16. This embodiment of the run plug 16 comprises an oscillator and driver component 46, a filter 48, and an rectifier 50, which allow for the run plug 16 to function as a unique key to the safety circuit 18. The oscillator and driver component 46 may be configured to generate a signal with a predefined frequency. The filter 48 and the rectifier 50 may be configured to allow the run plug 16 to establish the electrical pathway between the run plug pins 42 and 44 only if presented with the signal with the predefined frequency.

From the above description of the low-current run plug circuit 10, it is manifest that various techniques may be used for implementing the concepts of the low-current run plug circuit 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that low-current run plug circuit 10 is not limited to the particular embodiments described herein, but is capable of many embodiments without departing from the scope of the claims.

I claim:

1. A low-current run plug circuit comprising:
   $1^{st}$ and $2^{nd}$ terminals configured to pass through an external wall of a battery-powered apparatus;
   a run plug configured to electrically connect the $1^{st}$ and $2^{nd}$ terminals on an exterior side of the external wall when the run plug is installed, wherein when the run plug is removed no current flows between the $1^{st}$ and $2^{nd}$ terminals;
   a safety circuit mounted within the battery-powered apparatus comprising:
      a junction field effect transistor (JFET) having a gate terminal ($G_1$), a drain terminal ($D_1$), and a source terminal ($S_1$), wherein $D_1$ is configured to be electrically connected to a cathode of the apparatus' battery;
      a current set resistor ($R_A$) electrically connected between the $1^{st}$ terminal and $S_1$, wherein $G_1$ is electrically connected between the $1^{st}$ terminal and $R_A$ such that a current $I_A$ flowing to the $1^{st}$ terminal is set by a transfer function of the JFET and $R_A$;
      a P-channel enhancement mode metal oxide silicon field effect transistor (MOSFET) having a gate terminal ($G_2$), a drain terminal ($D_2$), and a source terminal ($S_2$), wherein $D_2$ is configured to be electrically connected to an electrical load within the apparatus;
      a voltage divider having an input ($V_{in}$), an output ($V_{out}$), and a ground terminal ($GR_1$), wherein $V_{in}$ is electrically connected to $S_2$ and $D_1$, and wherein $V_{out}$ is electrically connected to $G_2$; and
      an N-channel MOSFET having a gate terminal ($G_3$), a drain terminal ($D_3$), and a source terminal ($S_3$), wherein $D_3$ is electrically connected to $GR_1$, $G_3$ is electrically connected to the $2^{nd}$ terminal, and $S_3$ is electrically connected to a ground such that when the run plug is removed the N-channel MOSFET and the P-channel MOSFET are in cutoff wherein no current flows to the electrical load, and such that when the run plug is installed, the safety circuit creates a low-impedance electrical path from the cathode to the electrical load.

2. The low-current run plug circuit of claim 1, wherein the battery-powered apparatus is designed to function underwater.

3. The low-current run plug circuit of claim 2, wherein the battery-powered apparatus is an autonomous underwater vehicle.

4. The low-current run plug circuit of claim 1, wherein when the run plug is installed, the safety circuit is configured such that electrical current flows through the run plug and creates a voltage at gate terminal $G_3$, which drives the N-channel MOSFET to saturation such that the N-channel MOSFET pulls current from the apparatus' battery through the voltage divider so as to pull the P-channel MOSFET into saturation.

5. The low-current run plug circuit of claim 1, wherein the exterior is designed to be exposed to seawater.

6. The low-current run plug circuit of claim 1, wherein the exterior is designed to be exposed to ambient environments where a spark at the $1^{st}$ and $2^{nd}$ terminals could cause an explosion.

7. The low-current run plug circuit of claim 1, wherein the current set resistor and the gate terminal $G_3$ are electrically connected respectively to the $1^{st}$ and $2^{nd}$ terminals by wires having a gauge of 18 to 40.

8. The low-current run plug circuit of claim 1, wherein the voltage divider comprises a resistor $R_B$ electrically connected in series to a resistor $R_D$, wherein $R_D$ is directly connected to $GR_1$, $R_B$ is directly connected to $V_{in}$, and $V_{out}$ is electrically connected between $R_B$ and $R_D$.

9. The low-current run plug circuit of claim 8, further comprising a resister Rc electrically connected between the ground and the $2^{nd}$ terminal.

10. The low-current run plug circuit of claim 1, wherein the external wall forms a water-tight enclosure.

11. A low-current run plug circuit comprising:
    a run plug receptacle having $1^{st}$ and $2^{nd}$ terminals, wherein the run plug receptacle is mounted to an external wall of a battery-powered apparatus;
    a run plug configured to plug into the run plug receptacle so as to electrically connect the $1^{st}$ and $2^{nd}$ terminals such that when the run plug is removed no current flows between the $1^{st}$ and $2^{nd}$ terminals;
    a safety circuit mounted within the battery-powered apparatus comprising:
       a junction field effect transistor (JFET) having a drain terminal $D_1$ that is electrically connected to a cathode of the apparatus' battery;
       a P-channel enhancement mode metal oxide silicon field effect transistor (MOSFET) having a drain terminal $D_2$ that is electrically connected to an electrical load within the apparatus;
       a voltage divider having an input $V_{in}$ that is electrically connected to the cathode, $D_1$, and to a source terminal $S_2$ of the P-channel MOSFET, and wherein the voltage divider further has an output $V_{out}$ that is electrically connected to a gate terminal $G_2$ of the P-channel MOSFET;
       an N-channel MOSFET having a drain terminal $D_3$ that is electrically connected to a ground terminal $GR_1$ of the voltage divider; and
    wherein a gate terminal $G_3$ of the N-channel MOSFET is electrically connected to the $2^{nd}$ terminal, and a source terminal $S_3$ of the N-channel MOSFET is electrically connected to a ground such that when the run plug is removed from the receptacle, the N-channel MOSFET and the P-channel MOSFET are in cutoff wherein no current flows from the battery to the electrical load, and such that when the run plug is installed, the safety circuit creates a low-impedance electrical path from the battery to the electrical load.

12. The low-current run plug circuit of claim 11, further comprising a current set resistor $R_A$ that is electrically connected between the $1^{st}$ terminal and a source terminal $S_1$ of the JFET.

13. The low-current run plug circuit of claim 12, wherein a gate terminal $G_1$ of the JFET is electrically connected between the $1^{st}$ terminal and $R_A$.

14. The low-current run plug circuit of claim 13, wherein the external wall forms a water-tight enclosure in which the safety circuit is disposed.

15. The low-current run plug circuit of claim 14, wherein the voltage divider comprises a resistor $R_B$ electrically connected in series to a resistor $R_D$, wherein $R_D$ is directly connected to $GR_1$, $R_B$ is directly connected to $V_{in}$, and $V_{out}$ is electrically connected between $R_B$ and $R_D$.

16. The low-current run plug circuit of claim 15, further comprising a resister Rc electrically connected between the ground and the $2^{nd}$ terminal.

17. The low-current run plug circuit of claim 16, wherein a current $I_A$ flowing to the $1^{st}$ terminal from the JFET is less than 10 microamps.

18. The low-current run plug circuit of claim 17, wherein the current set resistor and the gate terminal $G_3$ are electrically connected respectively to the $1^{st}$ and $2^{nd}$ terminals by wires having a gauge of 28-38.

19. A low-current run plug circuit comprising:
   a run plug receptacle having $1^{st}$ and $2^{nd}$ terminals, wherein the run plug receptacle is mounted to an external wall of a battery-powered apparatus;
   a run plug configured to plug into the run plug receptacle and comprising:
      an internal battery;
      a junction field effect transistor (JFET) having a drain terminal $D_1$ that is electrically connected to the internal battery so as to provide power to the JFET;
   a safety circuit mounted within the battery-powered apparatus comprising:
      a P-channel enhancement mode metal oxide silicon field effect transistor (MOSFET) having a drain terminal $D_2$ that is electrically connected to an electrical load within the apparatus;
      a voltage divider having an input $V_{in}$ that is electrically connected to a cathode of the apparatus' battery and to a source terminal $S_2$ of the P-channel MOSFET, and wherein the voltage divider further has an output $V_{out}$ that is electrically connected to a gate terminal $G_2$ of the P-channel MOSFET;
      an N-channel MOSFET having a drain terminal $D_3$ that is electrically connected to a ground terminal $GR_1$ of the voltage divider; and
   wherein a gate terminal $G_3$ of the N-channel MOSFET is electrically connected to the $2^{nd}$ terminal, and a source terminal $S_3$ of the N-channel MOSFET is electrically connected to a ground such that when the run plug is removed from the receptacle, the N-channel MOSFET and the P-channel MOSFET are in cutoff wherein no current flows from the apparatus' battery to the electrical load, and such that when the run plug is installed and the internal battery still has power, the safety circuit creates a low-impedance electrical path from the apparatus' battery to the electrical load.

20. The low-current run plug circuit of claim 19, wherein the run plug further comprises:
   an oscillator and a driver component configured to provide a signal with a predefined frequency;
   a filter configured to receive the signal; and
   a rectifier connected between the filter and the JFET such that the internal battery provides power to the JFET only when the signal with the predefined frequency is presented to the filter.

* * * * *